(12) United States Patent
Bierer

(10) Patent No.: US 6,459,252 B1
(45) Date of Patent: Oct. 1, 2002

(54) AC PHASING VOLTMETER

(76) Inventor: Walter S. Bierer, 183 Elton Walker Rd., Blythewood, SC (US) 29016

( * ) Notice: Subject to any disclaimer, the term of this patent is extended or adjusted under 35 U.S.C. 154(b) by 0 days.

(21) Appl. No.: 09/766,254

(22) Filed: Jan. 18, 2001

(51) Int. Cl.[7] .......................... G01R 31/02; G01R 19/00
(52) U.S. Cl. ........................................ 324/72.5; 324/126
(58) Field of Search ................................ 324/72.5, 141, 324/142, 149, 117 R, 103 R, 126, 127

(56) References Cited

U.S. PATENT DOCUMENTS

| | | |
|---|---|---|
| 2,452,880 A | 11/1948 | Van Beuren |
| 2,641,630 A | 6/1953 | Goldenberger et al. |
| 3,273,051 A | 9/1966 | Povey et al. |
| 3,392,334 A | 7/1968 | Bevins |
| 3,798,541 A | 3/1974 | Campbell, Jr. |
| 3,826,981 A | 7/1974 | Ross |
| 4,328,461 A | 5/1982 | Butters et al. |
| 4,839,581 A | 6/1989 | Peterson, Jr. |
| 4,870,343 A | 9/1989 | Dooley et al. |
| 4,952,869 A | * 8/1990 | Tuttle ..................... 324/117 R |
| 5,136,234 A | 8/1992 | Shaw |
| 5,181,026 A | 1/1993 | Granville |
| 5,270,660 A | 12/1993 | Werner, Jr. et al. |
| 5,291,124 A | 3/1994 | Hoffman et al. |
| 5,293,113 A | 3/1994 | Beha et al. |
| 5,684,405 A | 11/1997 | Rhein |
| 6,043,640 A | * 3/2000 | Lauby et al. ............ 324/117 H |

* cited by examiner

*Primary Examiner*—Christine Oda
*Assistant Examiner*—James Kerveros
(74) *Attorney, Agent, or Firm*—Nexsen Pruet Jacobs & Pollard, LLC; Timothy J Slabouz; Michael A Mann

(57) ABSTRACT

A phasing voltmeter having a high impedance AC voltmeter in series with two high impedance probes. Shielding surrounds and electrically isolates the voltmeter and probes. In parallel with the voltmeter and connected electrically with the shielding is an electrical circuit designed to add the capacitive current to a current detected by the probes. The capacitive current is added in such a way that the net effect on the measured current is zero. The electrical circuit comprises two impedance elements, such as resistors, that meet at a junction where they are connected to the shielding. The impedances on either side of the junction are matched either by careful selection of the elements or by selection of adjustable elements so that the junction is a null point.

16 Claims, 5 Drawing Sheets

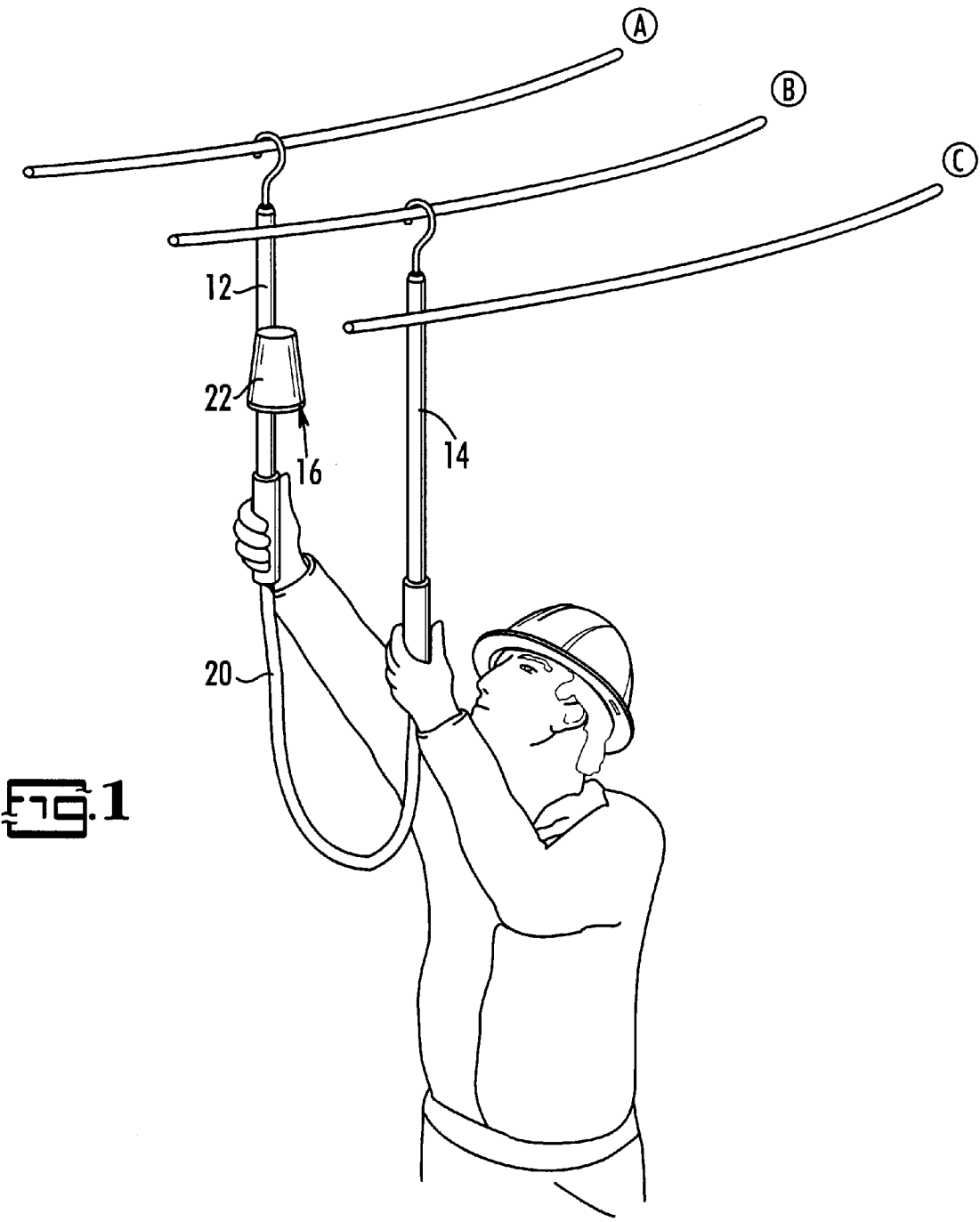

AC PHASING VOLTMETER

FIELD OF THE INVENTION

The present invention relates to voltmeters generally and to voltmeters for use in electrical power transmission line servicing and maintenance in particular.

BACKGROUND OF THE INVENTION

Electricity transmitted through power lines destined for commercial, industrial and residential use can involve hundreds of thousands of volts and high currents. Inevitably, there is an element of danger in measuring the voltage on a transmission line because of the need to make contact with the line. Indeed, even the proximity to a high voltage line may be sufficient to cause a spark to jump through the air to the nearest object. Nonetheless, in installing, servicing and repairing power lines, there are various occasions when contact is made, such as when the voltage carried by a line must be measured.

The circumstances and equipment used for measurements of the voltage of transmission lines varies considerably. For example, the absolute voltage carried by a line may be measured by a "high line resistive voltmeter." As another example, in servicing or repairing voltage regulators, an "off neutral detector" is used to determine if the regulator is passing current or has been effectively isolated from the power source. In still another application, a "phasing voltmeter" is customarily used in connecting individual lines of the multi-phase transmission power lines. The phasing voltmeter helps to prevent two lines that are not in phase from being connected inadvertently. Phasing voltmeters are not very accurate and generally do not need to be in order to indicate which lines are in phase and which are not. For accuracy, high line resistive voltmeters are used.

However, if a phasing voltmeter were accurate, it may have additional uses, such as replacing the high line resistive voltmeter or the off neutral detector. In order to be accurate, an alternating current phasing voltmeter should be capable of making four very distinctly different voltage measurements: phase to phase (FIG. 2A), phase to ground (FIG. 2B), ground to phase (FIG. 2C), and zero reference test (FIG. 2D). This last measurement should indicate very nearly zero volts when measuring the voltage difference between two conductors of the same phase and voltage or between two points on the same conductor.

Presently, high voltage phasing voltmeters use two high voltage resistors in series with each other and a meter and a cable. The resistors are housed in two insulated holders that are connected to the series cable and the series meter. The holders will have metal hooks or other fittings on their ends for good electrical contact with transmission lines. Often the meter is mounted to one of the two insulated holders (see FIG. 1) and oriented so that the electric utility worker can read the voltage displayed on the meter. "Hot sticks" may be used to hold and elevate the entire assembly. The meter may be designed to measure either voltage or current, but its display indicates voltage. However, the indicated voltage is not always the true voltage difference for the four types of measurements listed above.

High voltage measurements are plagued with inaccuracies stemming from stray capacitive charging currents. At high voltages, these stray currents emanate from the surface of every component of the measuring device including the cable. The capacitive current is related to the capacitive reactance, Xc, which can range from several thousand ohms on up, depending on the position of the meter and cable with respect to the ground. Under extreme conditions, such as when the series cable is lying directly on the ground between two pad-mounted transformers, the value of the capacitive reactance can be very low. The resulting capacitive current can then equal or exceed the measured current. Moreover, the voltage measured by the meter varies depending on the location of the meter and cable.

To demonstrate the theoretical limits of the inaccuracy of the prior art phasing voltmeter, assume that the capacitive current goes to a maximum (capacitive reactance goes to zero). This situation would electrically ground the series cable. The inaccuracies for the four basic measurements would be 15% too high for phase to phase, 100% too high for phase to ground, zero for ground to phase, and 200% of line to ground voltage for the zero reference test.

If the inaccuracies in phasing voltmeters attributable to capacitive currents could be eliminated, phasing voltmeters could be used to make measurements currently made by high line resistive voltmeters and off neutral detectors. This would eliminate the need for these additional voltmeters and provide measurements in which electrical utility employees can have greater confidence.

The problem of the inaccuracies introduced by the capacitive currents is known, and there have been attempts to address this problem. One solution is to keep the current actually measured by the phasing voltmeter relatively large compared to the capacitive current so the error introduced by the latter is relatively small. However, larger currents carry with them heat that can affect the resistance of the high voltage dropping resistors, which introduces another source of error if the phasing voltmeter is kept in contact with the line too long. Bevins in U.S. Pat. No. 3,392,334 teaches that the cable must be kept as short as possible and that use of two conductors in the interconnect cable can nullify the effects of capacitive current. However, neither of these steps corrects the error. For example, a phase to ground reading with a phasing meter having dual conductors in the cable will be the same as the ground to phase reading, but both will understate the actual voltage. Keeping the cable short certainly helps with accuracy but makes the phasing voltmeter less useful than one with a longer cable.

Thus there remains a need for a phasing voltmeter that is accurate regardless of the capacitive current.

SUMMARY OF THE INVENTION

According to its major aspects and briefly recited, the present invention is a phasing voltmeter where the capacitive currents are combined with the primary voltage measurement of the electrical transmission lines in such a way that the capacitive current has no net affect on the voltage measured regardless of the magnitude of the capacitive current. Thus, the meter and cable can be moved about without affecting the primary voltage measurement, and the cable can be of any length.

The present phasing voltmeter includes a pair of high impedance resistors in series with a cable and a high impedance alternating current (AC) voltmeter, essentially similar to the prior art phasing voltmeters, but also having a low impedance electrical circuit in parallel with the meter and that is tied at a single point of contact to electrical shielding provided for the resistors, cable and AC voltmeter. This shielding picks up the capacitive currents in the vicinity of the phasing voltmeter.

By this arrangement, the present phasing voltmeter establishes three voltage divider networks. The first voltage divider network divides the source voltage by an exact amount and provides a precise voltage to the AC voltmeter. The second voltage divider network divides the voltage between the first high impedance resistor and the single point shield attachment. The third voltage divider network divides the voltage between the second high impedance resistor and the A single point shield attachment. The vector sum of the three voltages thus established across the AC voltmeter input from these three voltage divider networks is exactly proportional to the source voltage. Thus, the second and third voltage divider networks allow the capacitive current to be coupled to the measured voltage in such a way that it has no net effect on the measured voltage.

A number of different embodiments of this electrical circuit are described herein, but a preferred one includes three resistors in series. The first is an adjustable gain resistor. The second is a null resistor tied to the shielding. The third is a balance resistor. Before the first use of the present phasing voltmeter, the gain and null resistors are set so that the particular system is balanced. Thereafter, no further adjustments are needed and the voltmeter will read true.

By adding switches and additional gain, null and balance resistors in accordance with the present invention and replicating, the electrical circuit can be established to provide range selection so that the displayed voltage will fall into one of a plurality of ranges selected by the user.

A feature of the present invention is the electrical circuit in parallel with the AC voltmeter. This simple circuit allows the capacitive current to be combined with the measurement of the voltage in such a way that there is no net effect regardless of the magnitude or changes in the capacitive current. This result has a number of advantages.

First, it eliminates what is potentially a large source of error in the measurement of voltages using phasing voltmeters, thus making much more accurate measurements possible. An accurate phasing voltmeter has other uses, as mentioned above. Moreover, an accurate phasing voltmeter helps electrical utility employees engaged in the servicing and repair of power lines to avoid injuries.

Second, it allows the measurement to be done anywhere and with any length of cable. A longer cable increases capacitive currents but as long as there is no net affect on the voltage measurement, it does not matter how long the cable is.

Third, the present invention allows the voltmeter to make its measurements on much smaller currents because the capacitive current is not a factor. Prior art meters reduced the impact of capacitive current by keeping the current running through the high voltage resistors and the meter relatively higher. Because lower currents can be used with the present device, resistors are kept cooler and can be used longer without heating up and causing the electrical resistance coefficient to drift.

These and other features and their advantages will be apparent to those skilled in the art of transmission line voltage measurement from a careful reading of the Detailed Description of Preferred Embodiments accompanied by the following drawings.

BRIEF DESCRIPTION OF THE DRAWINGS

In the figures,

FIG. 1 illustrates a phasing voltmeter in use.

DETAILED DESCRIPTION OF PREFERRED EMBODIMENTS

The present invention is a phasing voltmeter that is an improvement over existing phasing voltmeters. Externally, and to a significant extent internally, the present phasing voltmeter has many of the same features as prior art voltmeters and operates in much the same way.

Figure 2A:
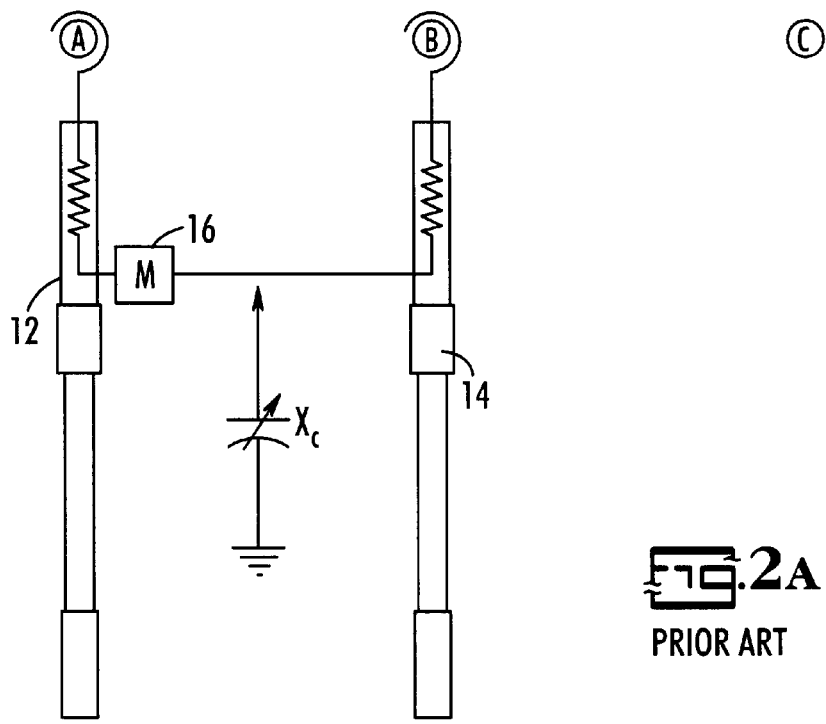
FIGS. 2A–2D illustrates the four basic types of measurements for which a phasing voltmeter may be used.
Figure 2B:
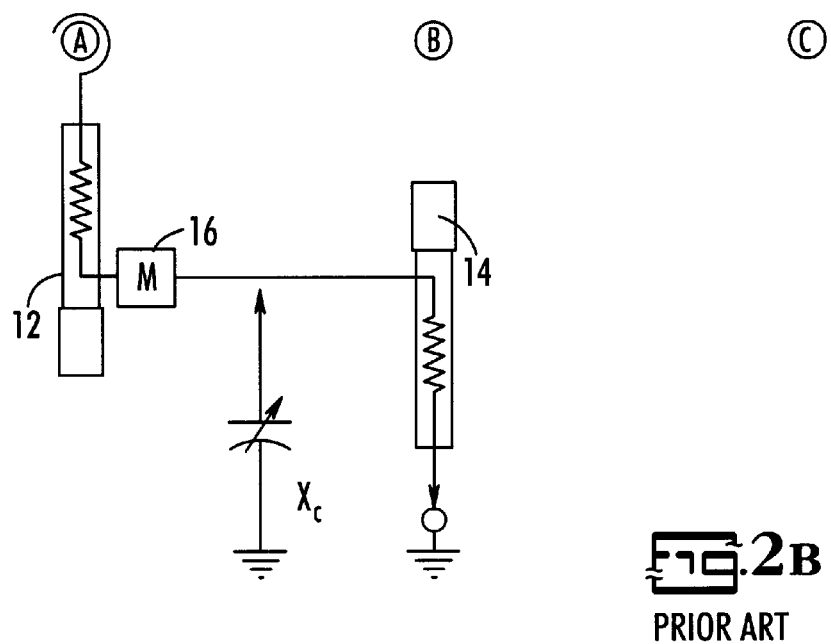
Figure 2C:
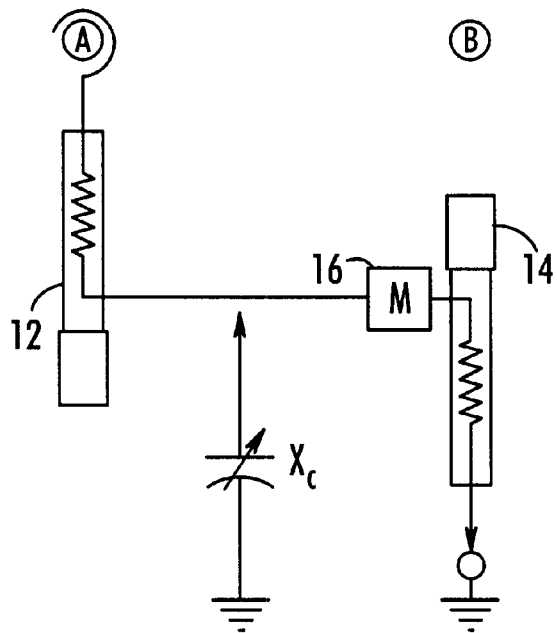
Figure 2D:
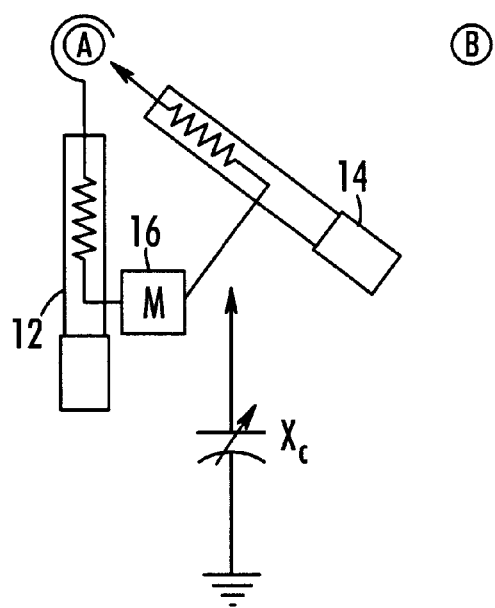
Figure 3:
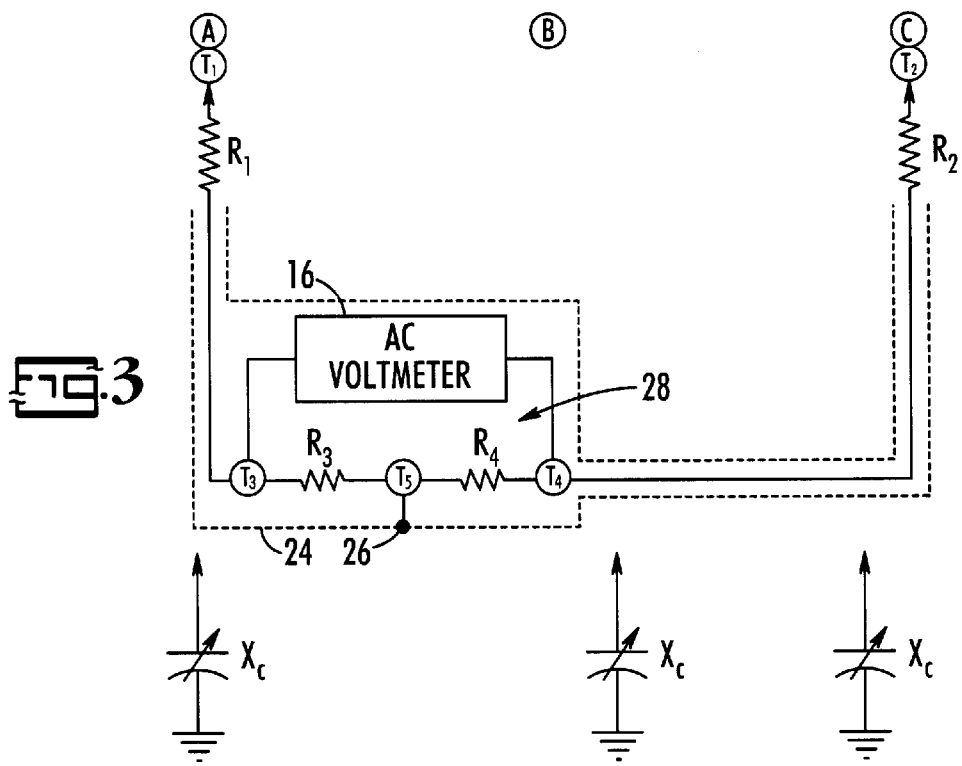
FIG. 3 is a schematic illustration of a phasing voltmeter according to a preferred embodiment of the present invention.

Referring now to FIGS. 1 and 3, the present invention is illustrated schematically and generally indicated by reference number 10. The circles designated A, B, and C represent electrical power lines carrying alternating current where each line is 120 degrees out of phase with the other two lines. The transmission lines are of course not part of the present invention. The measurement of the voltage is being made across the A and B lines in FIG. 1 and across the A and C lines in FIG. 3.

A first probe 12 is shown in contact with the A line; a second probe 14 is shown in contact with the B line. First probe 12 includes a resistor R1; second probe 14 includes a resistor R2. Ideally, these two resistors have large resistances and are matched so that the resistance of R1 and R2 are the same or very close in magnitude. The resistances of R1 and R2 are preferably tens of millions of ohms, such as, for example, 50,000,000 ohms.

Between first and second probes 12, 14, and electrically in series with them, is a voltmeter 16, which, by itself and in prior art phasing voltmeters is well known in the art. In the present invention voltmeter 16 must be AC, and the impedance of voltmeter 16 should be large compared to the balance of the electrical circuit, preferably on the order of 10,000 times larger than the impedance of the balance of the electrical circuit in parallel with it and to be described presently. The combined impedances of voltmeter 16 and Resistors R1 and R2 should be sufficient to keep the current very low, on the order of a milliamp or preferably less, with approximately 0.5 milliamp being most preferred, in a phasing voltmeter 10 that can be in contact with transmission lines continuously without resistive heating of resistors R1 and R2 or the components of voltmeter 16 affecting the measurement significantly.

Connecting resistors R1 and R2 and voltmeter 16 is a cable 20. Voltmeter 16 is encased in housing 22 and mounted to either first probe 12 or second probe 14 so that cable 20 may run from voltmeter 16 mounted on first probe 12 to second probe 14 rather than to both first and second probes 12, 14, from voltmeter 16, as illustrated.

Electrical shielding 24 comprises shielding on cables inside of first and second probes 12, 14, shielding on cable 20 and shielding on the aluminum or other non-ferrous metal of housing 22 of voltmeter 16. Resistors R1 and R2 are also preferably shielded as part of shielding 24 by, for example, the use of coaxial resistors. Shielding 24 is electrically isolated from probes 12, 14, cable 20 and voltmeter 16 except for a single point of contact at 26. Because shielding 24 extends over substantially the whole of phasing voltmeter 10, it helps to assure that the capacitive reactance, Xc, between the ground and every part of phasing voltmeter 10 is the same. The capacitive reactance will vary depending on the physical relationship between phasing voltmeter 10 and the ground, but wherever phasing voltmeter 10 is, Xc will be the same throughout shielding 24.

In parallel with voltmeter 16 is an electrical circuit 28 that couples the capacitive current to the current running through phasing voltmeter 10 from lines A to C (FIGS. 3–5), so that voltmeter 16 measures both. However, the nature of electrical circuit 28, as will be explained, is such that the net effect of the capacitive current is zero. The term "electrical circuit" will be understood to mean impedance elements in electrical connection with each other and that achieve a particular function as described herein and many examples of which are illustrated in FIGS. 3, 4A–4F, and 5. Other impedance elements may be arranged to perform the same function. In particular, electrical circuit 28 is adapted to be connected electrically in parallel with voltmeter 16 and to have a junction between its components that, because of the selection of components can be, or be made to be, a null point for connection of contact 26 to shielding 24 so that the capacitive current, whatever it may be, can be added to the current flowing through phasing voltmeter 10 with no net increase or decrease in displayed voltage. To achieve this null point, the voltage divider networks on either side of the junction must be essentially identical.

Electrical circuit 28 in the embodiment illustrated in FIG. 3 includes two resistors: R3, and R4. The magnitude of resistors R3 and R4 should be as similar as possible and relatively small, on the order of 50 ohms for example.

Phasing voltmeter 10, as described, is thus a five terminal device consisting of two high impedance resistors, R1 and R2, and one low impedance element, electrical circuit 28, that together form three precision divider networks. The first and second terminals, T1 and T2, are the points of contact between first probe 12 and transmission line A (or other source voltage) and between second probe 14 and transmission line C (or other source voltage), respectively. The third and fourth terminals, T3 and T4, are the points of attachment to the inputs of voltmeter 16. Contact 26 is where shield 24 meets electrical circuit 28.

The first of these precision voltage divider networks divides the voltage between transmission lines A and C (or other source voltage) across probe 12 and probe 14 by an exact amount (such as by a factor of 1,000,000) and provides a precise voltage to voltmeter 16. Resistors R1 and R2 serve as the two primary voltage dropping resistors in this first precision voltage divider network. Resistors R3 and R4 serve as metering resistors in this first voltage divider network.

The second of the precision voltage divider networks divides the voltage between first probe 12 and contact 26 (also by a factor of, say 1,000,000) to produce a voltage that is precisely proportional to the charging current supplied by first probe 12 and delivers that voltage to voltmeter 16. R1 serves as the primary voltage dropping resistor of this network and R3 serves as a metering resistor in this network. R3 also serves as an extremely efficient (99.9999%) delivery path from R4 in the third precision voltage divider network to voltmeter 16.

Finally, the third precision voltage divider network divides the voltage between second probe 14 and contact 26 (by the same factor as in the second voltage divider network. R2 is the primary resistor in this third network and R4 is the metering resistor. R4 in the third network, as R3 was in the second network, is an extremely efficient delivery path for the second voltage divider network to voltmeter 16. These three voltages are summed vectorially and fed to voltmeter voltmeter 16. The voltages of the second and third voltage divider network add or subtract to the voltage of the first voltage divider network, leaving the voltage displayed by the voltmeter 16 equal to the voltage across transmission lines A and C.

Electrical circuit 28 can take a variety of forms other than that illustrated in FIG. 3. FIGS. 4A–4F illustrate six more forms for electrical circuit 28. In each of the illustrations of FIGS. 4A–4F, the reactance, Xc, is tied to shielding 24 at contact 26, but that is not shown to simplify the illustrations. Similarly, in each of the illustrations, the same precision voltage divider networks that include contact 26 as a terminal are established that permit the voltage measured by these networks to be added vectorially to the source voltage by voltmeter 16.

Figure 4A:
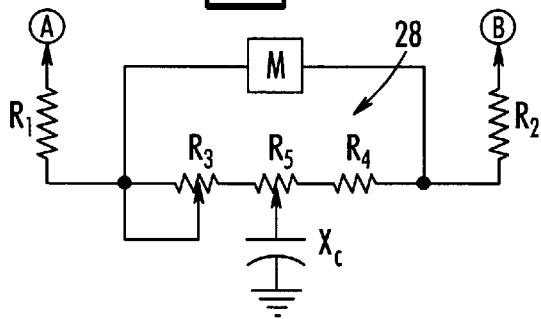
FIGS. 4A–4F illustrate six alternate embodiments of the electrical circuit used in a phasing voltmeter according to preferred embodiments of the present invention.
Figure 4B:
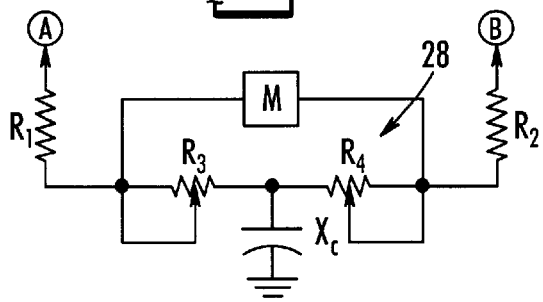

In FIG. 4A, gain resistor R3 is adjustable so that the combined impedance of R3, R4 and R5 can be adjusted to more easily form a precision voltage divider network with R1, R2, R3, R4 and R5. In FIG. 4B, balance resistor R4 and gain resistor R3 are both made adjustable.

Figure 4C:
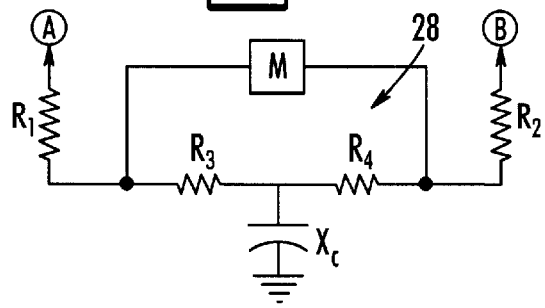
Figure 4D:
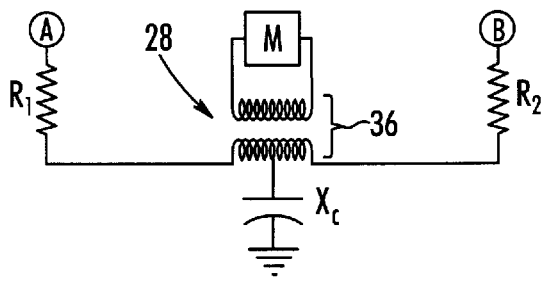

In FIG. 4D, a transformer 36 is used to determine voltage. The capacitive reactance is coupled to an intermediate point, via contact 26, on transformer 36 so that impedances on either side of the intermediate point balance, thus canceling the effect of the capacitive current.

Figure 4E:
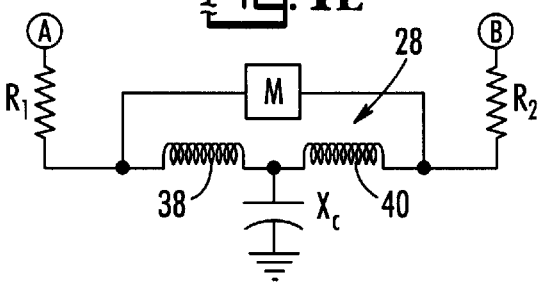
Figure 4F:
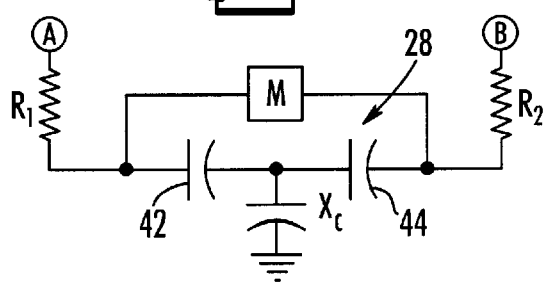

FIG. 4E illustrates yet another embodiment of the present invention. Between R1 and R2, and in parallel with voltmeter M are two inductors 38, 40, one on either side of the point of contact with capacitive reactance. When inductors 38, 40 are balanced, the capacitive current is added to the current in such a way that it has no net effect. FIG. 4F illustrates that capacitors 42, 44, can be substituted for inductors 38, 40 (FIG. 4E), or resistors R3 and R5 (FIG. 4C).

Importantly, any circuit component pair that uses impedance elements, such as a pair of resistors, capacitors or inductors, or a combination of these, can be used to create electrical circuit 28 in parallel with voltmeter 16. By connecting the shielding 24 to a point in this electrical circuit via contact 26 where the impedance on either side of the contact point is balanced or can be balanced by adjustment, the capacitive current in the shielding can be added to the current in the voltmeter so that there is no net effect regardless of how large or small the capacitive current is. The pair of components that make up the electrical circuit can be chosen to match each other impedance or be adjustable so that the impedance on either side of the contact point can be balanced and a null current point established.

Figure 5:
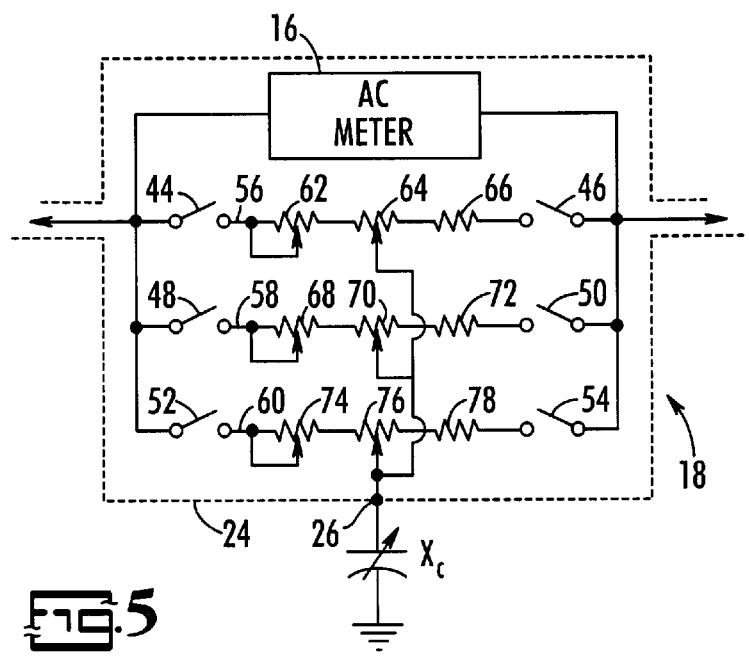
FIG. 5 is a schematic illustration of an electrical circuit arranged to operate also as a range selector, according to a preferred embodiment of the present invention.

FIG. 5 illustrates an embodiment for electrical circuit 28 in the form of a range selector 18 connected in parallel with voltmeter 16. Each range is selected by closing two switch pairs, 44 and 46, 48 and 50, or 52 and 54 which allows current to flow through an electrical circuit 56, 58, or 60, respectively, of the type just described. Each electrical circuit, 56, 58, and 60, includes three resistors in series: a gain resistor 62, 68. and 74; a null resistor 64, 70, and 76; and a balance resistor 66, 72, and 78, respectively. Gain resistors 62, 68, and 74 are adjustable to establish a precision voltage divider network. Null resistors 64, 70, and 76 are adjustable to "zero out" the effect of the capacitive current.

In a preferred embodiment, these ranges would include voltages up to 2 kV, to 20 kV and to 50 kV. The resolution at each of these levels is 1 volt, 10 volts and 100 volts. The number of ranges that can be selected and the ranges are somewhat arbitrary, and those skilled in the art of voltmeters for electrical power transmission will recognize that different ranges may be selected.

The present phasing voltmeter 10 is capable of accuracies of ±0.0001% or better with resistors of ±2%. Even when the resistors do not have the precise resistance they are rated to have, accuracy can still be obtained. As long as the impedance of the AC voltmeter 16 is high with respect to electrical circuit 28, the balance of the ratios of the networks is more significant than the balance of the resistance of the networks. In practice, a small AC voltmeter 12 can be preset to display a voltage 1,000,000 times greater than it detects on its input terminals. This ratio has a tolerance of slightly less than 1%, so that the voltage may actually range from 990,000 times to 1,010,000 times greater. As an example of the present invention, suppose the desired voltage divider ratio is 1,000,000 to one and R1's nominal resistance is 50,000,000 ohms but its actual resistance is 48,000,000. R2's nominal resistance is also specified as 50,000,000 but its actual resistance is 49,000,000 ohms. The gain resistor, R3, has a resistance that can range from zero to 50 ohms; the null resistor, R4, has a resistance that can range from zero to 10 ohms. The balance resistor, R5, has a nominal resistance of 45 ohms but actually has a resistance of 46 ohms.

The sum of the resistances of R1 and R2 is 97,000,000 so the resistance of the electrical circuit should be 97 ohms at 1,000,000 to one. Thus, the resistances of R3, R4, and R5 should sum to 97 ohms. R5 is fixed at 46 ohms; R4 is set to 10 ohms because adjusting it will not change the through resistance presented to the other components in the series string because of the way it is configured in the circuit. R3 is adjusted to 41 ohms (97 ohms less 10 ohms less 46 ohms).

Some portion of R4 and all of R3 will form a precision voltage divider network with R1. Because R1 is actually 48,000,000 ohms, this network should have a resistance of 48 ohms (again, at 1,000,000 to one). Since R3 is now set to 41 ohms, the portion of R4 must be 7 ohms.

The remainder of R4 (3 ohms) and R5 (46 ohms) must also equal one millionth of R2, or 49 ohms.

It will be apparent to those skilled in the art of electrical power transmission line servicing and maintenance equipment design that many modifications and substitutions can be made to the foregoing preferred embodiments without departing from the spirit and scope of the present invention.

What is claimed is:

1. A device for use in measuring voltage, said device comprising:
    a voltmeter;
    a first probe having a first probe resistor, said first probe resistor baving a first probe resistor electrical cable for electrically connecting said first probe resistor to said voltmeter;
    a second probe having a second probe resistor, said second probe resistor having a second probe resistor electrical cable for electrically connecting said second probe resistor to said voltmeter, wherein, when said first probe resistor and said second probe resistor are electrically connected to said voltmeter by said first probe resistor electrical cable and said second probe resistor electrical cable, said voltmeter is located electrically between and in series with said first probe resistor and said second probe resistor;
    electrical shielding surrounding and, except for a single point of contact, electrically isolated from said voltmeter, said first probe resistor, said second probe resistor, said first probe resistor electrical cable, and said second probe resistor electrical cable; and
    an electrical circuit in electrical connection with said shielding and in parallel with said voltmeter for providing compensation to measurement errors caused by the effects of capacitive current.

2. The device as recited in claim 1, wherein said electrical circuit includes a pair of impedance elements of about the same impedance that meet at a junction, and wherein said electrical shielding is electrically conductive and is electrically connected to said junction.

3. The device as recited in claim 2, wherein said impedance elements are selected from the group consisting of resistors, capacitors and inductors.

4. The device as recited in claim 1, wherein said electrical circuit includes a gain resistor, a null resistor and a balance resistor in series with each other, and said shielding is connected to said null resistor.

5. The device as recited in claim 4, wherein said gain resistor is adjustable.

6. The device as recited in claim 4, wherein said shielding is attached to said null resistor at a point and wherein said point of attachment is adjustable.

7. The device as recited in claim 1, wherein said capacitive current compensation is accomplished by said shielding, said electrical circuit, and said single point of contact providing at least one compensating current flow current path.

8. The device as recited in claim 1, wherein said voltmeter can provide an accurate voltage measurement and phasing of 120/208 VAC electrical systems and a resolution of about 1.0 VAC when measuring in the range of up to about 2000 VAC.

9. A device for use in measuring voltage, said device comprising:
    an alternating current voltmeter;
    a first probe resistor in series with said voltmeter, said first probe resistor having a first probe resistor cable for providing electrical communication between said first probe resistor and said voltmeter;
    a second probe having a second probe resistor in series with said voltmeter, said second probe resistor having a second probe resistor cable for providing electrical communication between said second probe resistor and said voltmeter, said voltmeter being located electrically between and in series with said first probe resistor and said second probe resistor through said first and second probe resistor cables;
    electrical shielding surrounding but, except for a single point of electrical contact, electrically isolated from said voltmeter, said first probe resistor cable and said second probe resistor cable, said shielding being electrically conductive, whereby said electrical shielding carries an un-metered capacitive current; and
    an electrical circuit having at least two series connected impedance elements in electrical connection with said shielding at said point of electrical contact and electrically in parallel with said voltmeter, said electrical circuit for adding said un-metered capacitive current carried by said shielding to a current running between said first probe resistor and said second probe resistor and for isolating said un-metered capacitive current carried by said shielding from direct contact with said first probe resistor and said second probe resistor, and wherein said single point of electrical contact between said shielding and said electrical circuit is made between said at least two series connected impedance elements.

10. The device as recited in claim 9, wherein at least one of said at least two series connected impedance elements has an adjustable impedance.

11. The device as recited in claim 9, wherein said electrical circuit includes means for selecting a range of voltage to be displayed on said voltmeter.

12. A device for use in measuring voltage, said device comprising:

a voltmeter;

a first probe having a first probe resistor, said first probe resistor having a first probe resistor cable for electrically connecting said first probe resistor to said voltmeter;

a second probe having a second probe resistor, said second probe resistor having a second probe resistor cable for electrically connecting said second probe resistor to said voltmeter, wherein, when said first probe resistor and said second probe resistor are electrically connected to said voltmeter by said first and second probe resistor cables, said voltmeter is located electrically between and in series with said first probe resistor and said second probe resistor;

electrical shielding surrounding, but electrically isolated from direct contact with, said voltmeter, said first probe resistor cable and said second probe resistor cable; and an electrical circuit having two impedance elements electrically in series, said electrical circuit in electrical connection with said electrical shielding at a single point of contact, said electrical circuit in parallel with said voltmeter, wherein said electrical circuit, shielding, and said single point of contact are used for providing voltage measurement compensation to offset measurement errors caused by capacitive current effects, and wherein said electrical circuit provides, except for said single point of contact, electrical isolation between said electrical shielding, and said first probe resistor cable and said second probe resistor cable and said voltmeter inputs, wherein said single point of contact is located between said two impedance elements of said electrical circuit.

13. The device as recited in claim 12, wherein said impedance elements are selected from the group consisting of resistors, capacitors, and inductors.

14. The device as recited in claim 12, wherein said electrical circuit corrects for voltmeter errors caused by a capacitive current loss from a total electrical current flowing from an electrical source being measured, wherein said correction is accomplished by said shielding collecting said capacitive current associated with said capacitive current loss carried in said shield and electrically transmitting said capacitive current to said electrical circuit, and wherein said electrical circuit vectorially adds said capacitive current in said shield back to said electrical current flowing between said first probe resistor and said second probe resistor so that said capacitive current has no net effect on measurement of said total electrical current flowing from said electrical source being measured.

15. The device as recited in claim 12, wherein at least one of said two series connected impedance elements has an adjustable impedance.

16. A device for use in measuring voltage, said device comprising:

a voltmeter;

a first probe having a first probe resistor in series with said voltmeter, said first probe resistor having a first probe resistor conductor for providing electrical communication between said first probe resistor and said voltmeter;

a second probe having a second probe resistor in series with said voltmeter, said second probe resistor having a second probe resistor conductor for providing electrical communication between said second probe resistor and said voltmeter, said voltmeter being located electrically between and in series with said first probe resistor and said second probe resistor;

a means for providing electrical shielding of said voltmeter, said first probe resistor conductor, and said second probe resistor conductor, and an electrical isolating, except for a single point of electrical contact, said shielding from said voltmeter, said first probe resistor conductor, and said second probe resistor conductor, said electrical isolation circuit comprised of pair of electrical impedance components, wherein each electrical impedance component of said pair of electrical impedance components is of the same type of electrical impedance component, wherein said electrical isolation circuit forms three voltage divider networks in parallel with said voltmeter, wherein the first of said three voltage divider networks contains said first probe resistor, said first probe resistor conductor, one component of said pair of electrical impedance components and electrical ground, wherein the second of said three voltage divider networks contains said second probe resistor, said second probe resistor conductor the other component of said pair of electrical impedance components and electrical ground, and wherein the third of said three voltage divider networks contains said first probe resistor, both first and second probe resistor conductors, both components of said pair of electrical impedance components,and said second probe resistor.

* * * * *